(12) United States Patent
Tran et al.

(10) Patent No.: US 7,038,538 B2
(45) Date of Patent: May 2, 2006

(54) FOLDED CASCODE HIGH VOLTAGE OPERATIONAL AMPLIFIER WITH CLASS AB SOURCE FOLLOWER OUTPUT STAGE

(75) Inventors: Hieu Van Tran, San Jose, CA (US); Sakhawat M. Khan, Los Altos, CA (US); William John Saiki, Mountain View, CA (US)

(73) Assignee: Silicon Storage Technology, Inc., Sunnyvale, CA (US)

(*) Notice: Subject to any disclaimer, the term of this patent is extended or adjusted under 35 U.S.C. 154(b) by 0 days.

(21) Appl. No.: 10/376,989

(22) Filed: Feb. 26, 2003

(65) Prior Publication Data
US 2003/0128072 A1    Jul. 10, 2003

Related U.S. Application Data

(63) Continuation of application No. 09/960,589, filed on Sep. 21, 2001, now Pat. No. 6,590,453.

(51) Int. Cl.
*H03G 5/16* (2006.01)
(52) U.S. Cl. ........................ 330/134; 330/133; 330/135
(58) Field of Classification Search ................ 330/250, 330/253, 255, 257, 258, 259, 261, 269, 626, 330/292, 260, 85, 264, 268, 123, 133–135
See application file for complete search history.

(56) References Cited

U.S. PATENT DOCUMENTS

| | | | |
|---|---|---|---|
| 4,284,957 A * | 8/1981 | Haque | 330/253 |
| 4,794,349 A * | 12/1988 | Senderowicz et al. | 330/253 |
| 5,285,168 A * | 2/1994 | Tomatsu et al. | 330/253 |
| 5,289,058 A * | 2/1994 | Okamoto | 327/334 |
| 5,631,606 A | 5/1997 | Tran | |
| 5,731,739 A * | 3/1998 | Ho | 330/253 |
| 5,783,934 A | 7/1998 | Tran | |
| 5,880,627 A * | 3/1999 | Thiel, V | 327/562 |
| 6,018,267 A | 1/2000 | Tran, et al. | |
| 6,466,093 B1 * | 10/2002 | Yan | 330/253 |
| 6,486,736 B1 * | 11/2002 | Cusinato et al. | 330/255 |
| 6,624,696 B1 * | 9/2003 | Eschauzier et al. | 330/255 |
| 6,781,463 B1 * | 8/2004 | Burt | 330/255 |

* cited by examiner

*Primary Examiner*—Peguy Jeanpierre
*Assistant Examiner*—Linh V. Nguyen
(74) *Attorney, Agent, or Firm*—DLA Piper Rudnick Gray Cary USLLP

(57) ABSTRACT

An operational amplifier comprises multiple stages. A differential input stage that includes an adaptive high voltage differential pair generates up and down output currents in response to up and down input voltages. The differential input stage includes adaptive common input high voltage (HV) bias. An intermediate stage converts the up and down output currents into a first output voltage signal. The intermediate stage includes a folded cascode arrangement. The intermediate stage is biased by fixed voltage bias signals. The intermediate stage also includes unaffected slew rate stability compensation and a combined split stability compensation. An output stage includes a class AB source follower driver that generates a second output voltage signal in response to the first output voltage signal. The output stage is biased with an adaptive push-pull source follower output HV bias. The output stage includes feed-forward slew rate enhancement. A local power supply pre-filter provides a filtered local high voltage to the differential input stage and stages that provide the fixed and adaptive voltage bias signals.

20 Claims, 8 Drawing Sheets

FOLDED CASCODE HIGH VOLTAGE OPERATIONAL AMPLIFIER WITH CLASS AB SOURCE FOLLOWER OUTPUT STAGE

RELATED APPLICATION

This application is a continuation of Ser. No. 09/960,589 filed on Sept. 21, 2001, now U.S. Pat. No. 6,590,453.

BACKGROUND

The present invention relates to an operational amplifier, and more particularly to stages of an operational amplifier including a class AB source follower output stage.

A conventional mixed mode integrated circuit system frequently uses different voltage supplies. Typically some analog signal processing, such as amplification, comparison, pulse generation, is performed at high voltage. A conventional operational amplifier that operates at high voltage (e.g., 14V) requires transistors and other devices that meet high voltage break down requirements, such as breakdown voltage of the drain with gate and source shorted to ground (BVDSS), breakdown voltage of the drain with gate shorted to ground and source floating (BVDSF), and breakdown voltage of gate oxide layer (BVOX). Conventional operational amplifiers use transistors with breakdown voltages that can sustain a HV supply.

SUMMARY OF THE INVENTION

The present invention provides a folded cascode high voltage operational amplifier that may include in various aspects adaptive common input high voltage (HV) bias, adaptive push-pull source follower output HV bias, feed-forward slew rate enhancement, unaffected slew rate stability compensation, a combined split stability compensation, and a local power supply pre-filter.

In one aspect, an operational amplifier comprises a differential input stage that includes an adaptive high voltage differential pair for providing first and second output currents in response to first and second input voltage signals applied thereto. An intermediate bias stage provides at least one bias signal. An intermediate stage converts the first and second output currents into a first output signal in response to the at least one bias signal. An output stage includes a class AB source follower driver for generating a second output signal in response to the first output signal.

DETAILED DESCRIPTION

As used herein, an NX NMOS transistor is a native device having a gate threshold voltage approximately equal to zero (Vt=~0 V). An NH NMOS transistor is an enhancement device having a gate threshold approximately in the range of 0.4–1.0 volts. An NX NMOS transistor normally has a higher breakdown voltage characteristic than an NH NMOS transistor due to a lower channel implant. Thus, the embodiments of the present invention may use NX NMOS transistors to buffer the high voltage breakdown.

Figure 1:
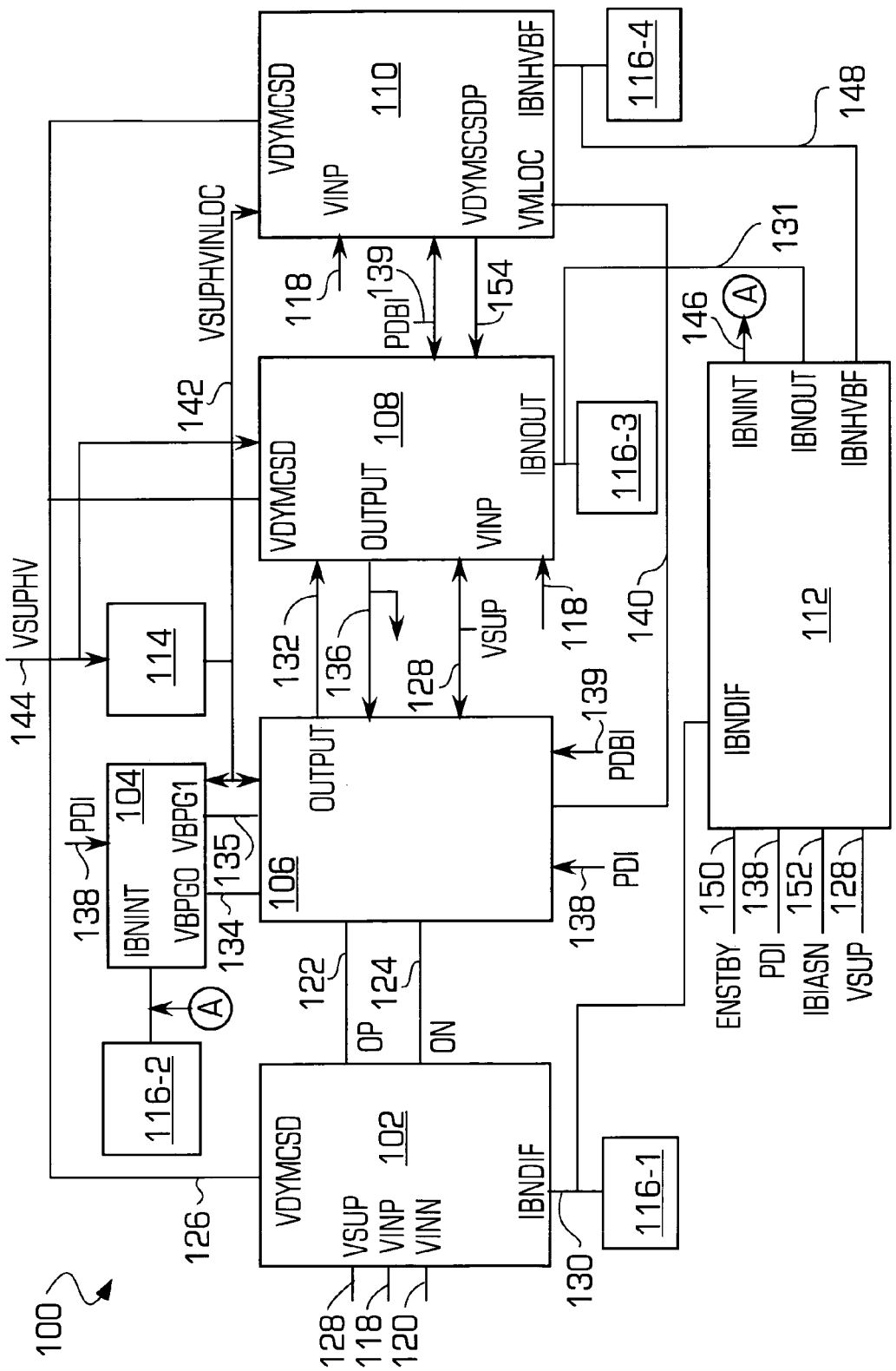
FIG. 1 is a block diagram of a high voltage operational amplifier in accordance with the present invention.

FIG. 1 is a block diagram of a high voltage operational amplifier 100 in accordance with the present invention. As an overview, the operational amplifier 100 may comprise transistors that have breakdown voltages less than a high voltage (HV) supply. In one embodiment, a charge pump locally generates the high voltage.

The high voltage operational amplifier 100 comprises a differential input stage 102, an intermediate bias stage 104, an intermediate folded current load stage 106, an output stage 108, an adaptive and fixed high voltage bias stage 110, a current bias generator 112, a local power supply (PS) pre-filter 114, and a plurality of current input bias circuits 116-1 through 116-4.

The differential input stage 102 converts a differential input of an up input voltage (VINP) 118 and a down input voltage (VINN) 120 into a differential current of an up output current (OP) 122 and a down output current (ON) 124. A first adaptive bias voltage (VDYMCSD) 126 from the adaptive and fixed high voltage bias stage 110 provides an adaptive input high voltage bias. A supply voltage (VSUP) 128 provides a fixed voltage bias. The current bias generator 112 generates an input bias current (IBNDIF) 130 that is locally filtered by the current input bias circuit 116-1 and applied to the differential input stage 102.

The intermediate bias stage 104 generates bias voltages for biasing elements within the intermediate folded current load stage 106. Specifically, the intermediate bias stage 104 generates a first bias voltage (VBPG0) 134 and a second bias voltage (VBPG1) 135.

The intermediate folded current load stage 106 converts the differential current (the up output current 122 and the down output current 124) from the differential input stage 102 into an output voltage 132, which is provided to the output stage 108. The supply voltage 128 is applied to the intermediate folded current load stage 106 to bias a compensation circuit 304 (see FIG. 3 below) therein. An output voltage 136 from the output stage 108 is fed back to the intermediate folded current load stage 106 for compensation adjustment. A power down signal 138 and an inverted power down signal 139 are applied to the intermediate folded current load stage 106, the output stage 108, and the adaptive and fixed high voltage bias stage 110 to control shut down in the event the power applied to the high voltage operational amplifier 100 is interrupted. A local medium voltage 140 from the adaptive and fixed HV bias stage 110 provides bias control to the intermediate folded current load stage 106. A local high voltage input supply voltage (VSUPH-VINLOC) 142 from the local power supply (PS) pre-filter 114 is applied to the intermediate folded current load stage 106.

The output stage 108 provides the output voltage 136 in response to the output voltage 132 from the intermediate folded current load stage 106. The first adaptive bias voltage (VDYMCSD) 126, a second adaptive bias voltage (VDYMCSDP) 154 from the adaptive and fixed high voltage stage 110, and the up input voltage (VINP) 118 each provide an adaptive bias to the output stage 108. A high voltage supply voltage (VSUPHV) 144 is applied to the output stage 108.

The adaptive and fixed high voltage bias stage 110 generates high voltages adaptive to the input voltage or the output voltage to provide input common mode input HV bias and output source follower HV bias, and also provides fixed local medium voltages. Specifically, the adaptive and fixed high voltage bias stage 110 generates the first adaptive bias voltage (VDYMCSD) 126, the second adaptive bias voltage (VDYMCSDP) 154, the local medium voltage (VMLOC) 140 in response to the local high voltage supply voltage (VSUPHVINLOC) 142 and the up input voltage (VINP) 118.

The current bias generator 112 provides a differential input stage bias current (IBNDIF) 130 to the differential input stage 102, an output stage bias current (IBNOUT) 131 to the output stage 108, an intermediate stage bias current (IBNINT) 146 to the intermediate bias stage 104, and a high voltage bias stage bias current (IBNHVBF) 148 to the adaptive and fixed HV bias stage 110 in response to the supply voltage (VSUP) 128, the power down (PDI) signal 138, a standby enable (ENSTBY) signal 150, and an input bias current (IBIASN) 152.

The local power supply (PS) pre-filter 114 filters the high voltage supply voltage (VSUPHV) 144 and generates the local high voltage input supply voltage (VSUPHVINLOC) 142 provided to the intermediate folded current load stage 106 and the adaptive and fixed HV bias stage 110.

The plurality of current input bias circuits 116-1 through 116-4 provide local filtering of the differential input stage bias current 130, the intermediate stage bias current 146, the output stage bias current 131, and the high voltage bias stage bias current 148, respectively. In one embodiment, the current input bias circuits 116-1 through 116-4 are disposed adjacent the respective differential input stage 102, the intermediate bias stage 104, the output stage 108, and the adaptive and fixed HV bias stage 110.

Differential Input Stage

The differential input stage 102 converts a differential input of the up input voltage (VINP) 118 and the down input voltage (VINN) 120 into a differential current of the up output current (OP) 122 and the down output current (ON) 124. The first adaptive bias voltage (VDYMCSD) 126 from the adaptive and fixed high voltage bias stage 110 provides an adaptive input high voltage bias. The supply voltage (VSUP) 128 provides a fixed voltage bias. The current bias generator 112 generates the input bias current (IBNDIF) 130 that is locally filtered by the current input bias stage 116-1 and applied to the differential input stage 102.

Figure 2:
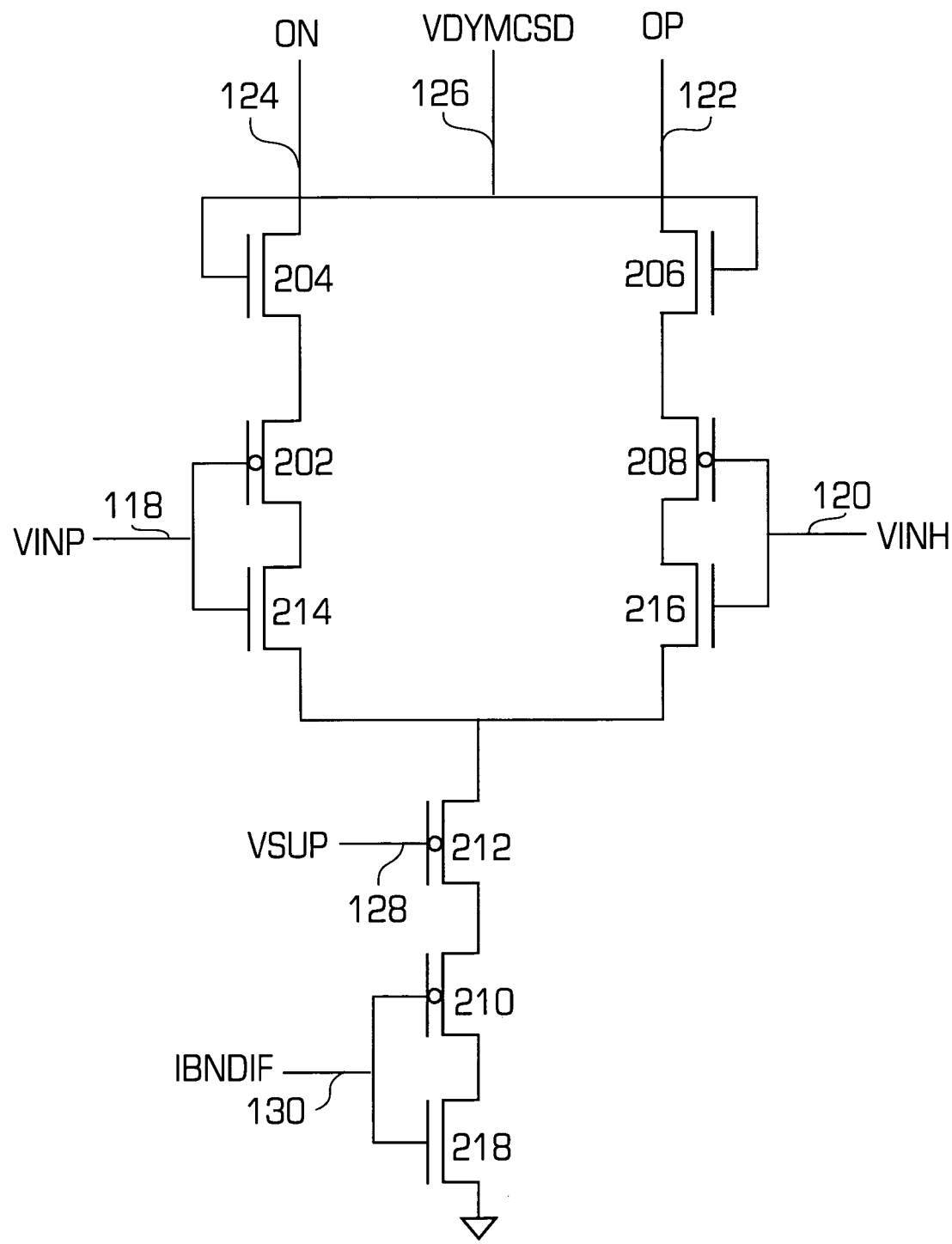
FIG. 2 is a schematic diagram of a differential input stage of the high voltage operational amplifier of FIG. 1.

FIG. 2 is a schematic diagram of the differential input stage 102 according to the present invention. The differential input stage 102 comprises NX NMOS transistors 202, 204, 206, 208, 210, 212 and NH NMOS transistors 214, 216, 218. The NX NMOS transistor 202 and the NH NMOS transistor 214 are coupled together as a self cascode input pair for the up input voltage (VINP) signal 118. The self cascode structure provides a cascode function without the additional complexity of cascading due to additional bias lines, and achieves high breakdown characteristics. For example, in a conventional cascode, transistors 202 and 214 have two separate lines, instead of one on their gates. The NX–NH self cascode structure provides a higher break down characteristic because of the higher break down of the NX transistor. The NMOS transistor 208 and the NH NMOS transistor 216 are coupled together as a self cascode input pair for the down input voltage signal (VINN) 120. The NX NMOS transistor 204 provides an adaptive input HV bias. The NX NMOS transistor 204 appropriately biases the self cascode input pair of the NX NMOS transistor 202 and the NH NMOS transistor 214 into the differential stage during operation. The NX NMOS transistor 204 includes drain-source terminals coupled between the down output current (ON) terminal 124 and a drain terminal of the NMOS transistor 202 and includes a gate coupled to receive the first adaptive bias voltage (VDYMCSD) signal 126.

The NX NMOS transistor 206 provides an adaptive input HV bias. The NX NMOS transistor 206 appropriately biases the self cascode input pair of the NX NMOS transistor 208 and the NH NMOS transistor 216 into the differential stage during operation. The NX NMOS transistor 206 includes drain-source terminals coupled between the up output current (OP) terminal 122 and a drain terminal of the NMOS transistor 208 and includes a gate coupled to the first adaptive bias voltage (VDYMCSD) signal 126 and the gate of the NMOS transistor 204.

The NX NMOS transistor 212 buffers the high voltage, and may be biased by an adaptive HV bias. The NX NMOS transistor 212 includes a drain terminal coupled to the common node formed of the source terminals of the NMOS transistors 214 and 216, and includes a gate terminal coupled to receive the supply voltage (VSUP) signal 128. In another embodiment, the gate of the NX NMOS transistor 212 is coupled to an adaptive voltage signal.

The NX NMOS transistor 210 and the NH NMOS transistor 218 provide current bias for the differential input stage 102. The NX NMOS transistor 210 and the NH NMOS transistor 218 include drain-source terminals coupled together in series between the source terminal of the NMOS transistor 212 and ground, and include a gate terminal coupled together and to receive the input bias current (IBNDIF) 130.

Intermediate Folded Current Load Stage:

Refer again to FIG. 1. The intermediate folded current load stage 106 converts the differential current formed of the up output current 122 and the down output current 124 from the differential input stage 102 into an output voltage 132.

Figure 3:
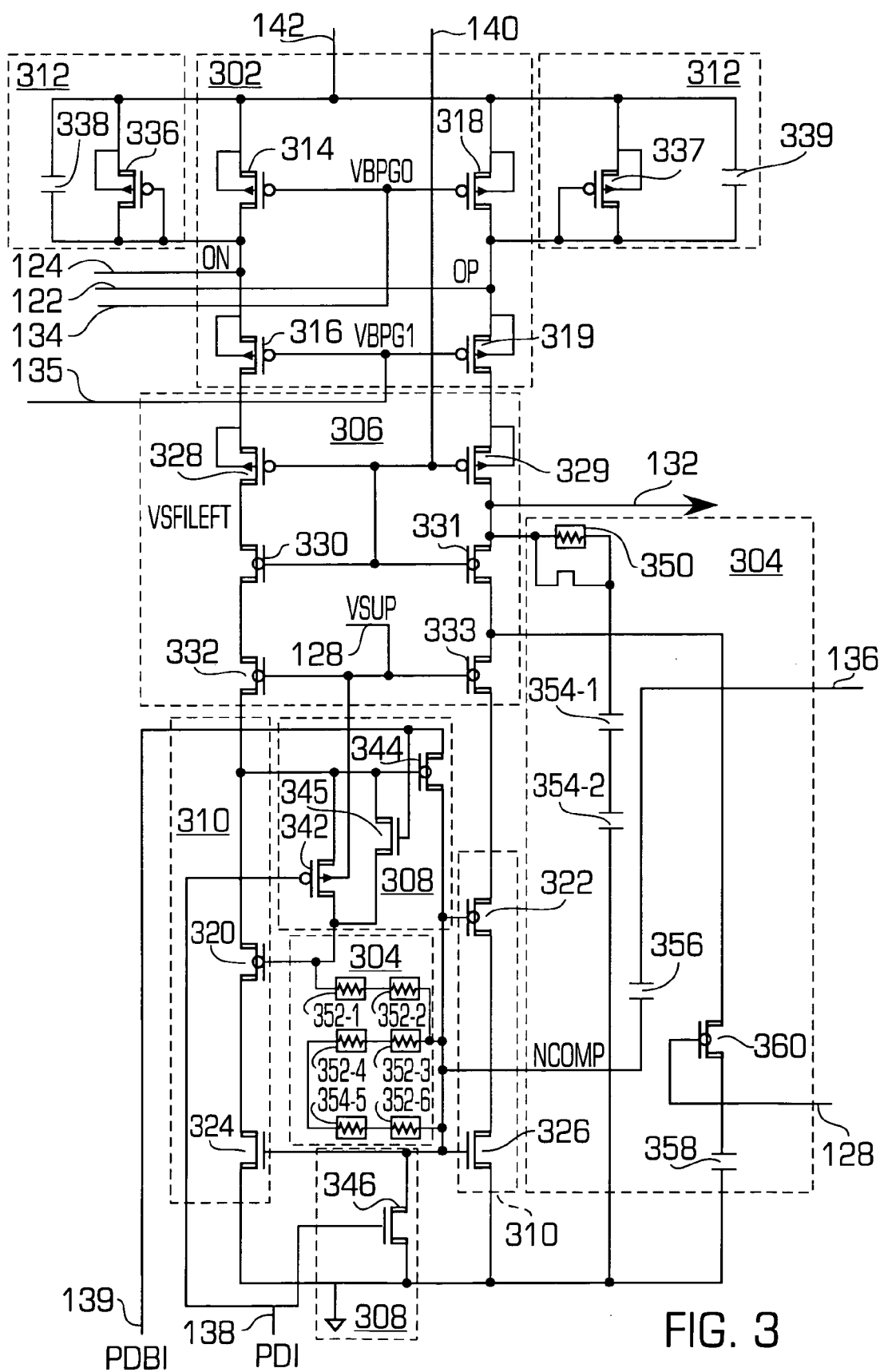
FIG. 3 is a schematic diagram of an intermediate folded current load stage of the high voltage operational amplifier of FIG. 1.

FIG. 3 is a schematic diagram of the intermediate folded current load stage 106 according to the present invention. The intermediate folded current load stage 106 comprises a folded cascode 302, a compensation circuit 304, an adaptive HV bias circuit 306, a power down circuit 308, a current mirror 310, and a recovery circuit 312.

The folded cascode 302 arranged with the differential input stage 102 suppresses high voltages by using an adaptive input to prevent breakdown. The folded cascode 302 receives the first bias voltage (VBPG0) 134 and the second bias voltage (VBPG1) 135 from the intermediate bias stage 104. The folded cascode 302 receives the up output current (OP) 122 and the down output current (ON) 124 from the differential input stage 102. The supply voltage 128 biases the adaptive HV bias circuit 306 and the compensation circuit 304. The output signal 136 from the output stage 108 is fed back to the compensation circuit 304 for compensation adjustment. The power down signal 138 and the inverted power down signal 139 are applied to the power down circuit 308 to control shut down in the event the power applied to the high voltage operational amplifier 100 is interrupted. The local medium voltage 140 from the adaptive and fixed HV bias stage 110 provides adaptive bias control to the adaptive HV bias circuit 306. The local high voltage input supply voltage (VSUPHVINLOC) 142 from the local power supply (PS) pre-filter 114 provides supply current to the folded cascode 302 and the recovery circuit 312.

The folded cascode 302 comprises PMOS transistors 314, 316, 318, 319. The PMOS transistors 314, 316 form a folded cascode for the down output current (ON) 124 from the differential input stage 102. The PMOS transistor 314 includes drain-source terminals coupled between the local high voltage input supply voltage (VSUPHVINLOC) signal 142 and the down output current (ON) 124, and includes a gate coupled to the first bias voltage (VBPG0) signal 134. The PMOS transistor 318 includes drain-source terminals coupled between the local high voltage input supply voltage (VSUPHVINLOC) signal 142 and the up output current (OP) 122, and includes a gate coupled to the common node formed of the gate of the PMOS transistor 314 and the first bias voltage (VBPG0) signal 134. The PMOS transistor 316 includes drain-source terminals coupled between the drain of the PMOS transistor 314 and the adaptive HV bias circuit 306, and includes a gate coupled to the second bias voltage (VBPG1) signal 135. The PMOS transistor 319 includes drain-source terminals coupled between the drain of the PMOS transistor 318 and the adaptive HV bias circuit 306, and includes a gate coupled to the common node formed of the gate of the PMOS transistor 316 and the second bias voltage (VBPG1) signal 135.

The adaptive HV bias circuit 306 prevents breakdown of the transistors of the intermediate folded current load stage 106. The adaptive HV bias circuit 306 biases the HV in the intermediate folded current load stage 106 as appropriate for operation of the stage 106. The adaptive HV bias circuit 306 comprises PMOS transistors 328, 329 and NX NMOS transistors 330, 331, 332, 333. The drain-source terminals of the PMOS transistor 328 and the NX NMOS transistors 330 and 332 are coupled together in series. The PMOS transistor 328 includes a source coupled to the drain of the PMOS transistor 316, and a drain coupled to the drain of the NX NMOS transistor 330. The source terminal of the NMOS transistor 330 is coupled to the drain terminal of the NX NMOS transistor 332. The source terminals of the NX NMOS transistors 332 and 333 are coupled to separate terminals of the current mirror 310. The drain-source terminals of the PMOS transistor 329 and the NX NMOS transistors 331 and 333 are coupled together in series. The PMOS transistor 329 includes a source coupled to the drain of the PMOS transistor 319, and a drain coupled to the drain of the NX NMOS transistor 331. The source terminal of the NX NMOS transistors 331 is coupled to the drain terminal of the NX NMOS transistor 333. The gates of the NX NMOS transistors 332 and 333 are coupled together and to the supply voltage (VSUP) signal 128. The gates of the PMOS transistors 328, 329 and the NX NMOS transistors 330 and 331 are coupled together and to the local medium voltage (VMLOC) signal 140 from the adaptive and fixed HV bias stage 110. The output voltage 132 is provided from the drain of the PMOS transistor 329. In another embodiment, the gates of the PMOS transistors 328, 329 and the NX NMOS transistors 330, 331 are coupled to an adaptive bias voltage.

The current mirror 310 converts the differential current into the output voltage 132. The current mirror 310 comprises NX NMOS transistors 320, 322, and NH NMOS transistors 324, 326 arranged as a current mirror. The source of the NH NMOS transistor 324 is coupled to the source of the NH NMOS transistor 326 and to ground. The gate of the NH NMOS transistor 324 is coupled to the gate of the NH NMOS transistor 326. The sources of the NX NMOS transistors 320 and 322 are coupled to respective drains of the NH NMOS transistors 324 and 326. The drain terminals of the NX NMOS transistors 320, 322 are coupled to the source terminals of the respective NX NMOS transistor 332, 333. The gates of the NX NMOS transistor 322 and the NH NMOS transistor 326 are coupled together and to the compensation circuit 304 and the power down circuit 308.

The recovery circuit 312 clamps the voltage on the folded cascode 302 during power transients. The recovery circuit 312 comprises PMOS transistors 336, 337 and capacitors 338, 339. The PMOS transistors 336 and 337 are diode connected and include drain-source terminals coupled between the drain-source terminals of the respective PMOS transistors 314 and 318. The PMOS transistors 336, 337 are recovery transistors that clamp the up output current 122 and the down output current 124 during transients to speed up the recovery of the cascode PMOS transistors 314, 318. In one embodiment, the PMOS transistors 336, 337 are sized such that during normal operation, the PMOS transistors 336, 337 are off so as to not affect the operation of the operational amplifier 100. The capacitors 338 and 339 are coupled in parallel between the drain-source terminals of the respective PMOS transistors 314 and 318 to enhance power supply ripple rejection.

The power down circuit 308 turns off the current mirror 310 during power down. The power down circuit 308 comprises a PMOS transistor 342, an NX NMOS transistor 344, and NH NMOS transistors 345 and 346 for power down. The drain-source terminals of the NMOS transistor 346 couples the common node formed of the gates of the NX NMOS transistor 322 and the NH NMOS transistors 324 and 326 to ground to turn off the NX NMOS transistor 322 and the NH NMOS transistors 324, 326 in the event that the power down (PDI) signal 138 is applied to the gate of the NH NMOS transistor 346.

The drain-source terminals of the PMOS transistor 342 and the NH NMOS transistor 345 are coupled in parallel between the drain terminal and the gate of the NX NMOS terminal 320. The gate of the PMOS transistor 342 is coupled to the power down (PDI) signal 138. The gate of the NMOS transistor 345 is coupled to the inverted power down (PDBI) signal 139. During normal operation, the power down (PDI) signal 138 is low (the inverted power down signal 139 is high), the transfer gate formed of the PMOS transistor 342 and the NH NMOS transistor 345 is on to thereby couple the drain and the gate of the NX NMOS transistor 320 together. At power down, the transfer gate formed of the PMOS transistor 342 and the NH NMOS transistor 345 is off to disconnect the drain from the gate of the NX NMOS transistor 320. The NX NMOS transistor 344 includes drain-source terminals coupled between the inverted power down (PDBI) signal 139 and the gates of the NX NMOS transistor 322 and the NH NMOS transistors 324 and 326. During normal operations, the gate of the NX NMOS transistor 344, which is biased by the source of the NX NMOS transistor 332, is on, and is coupled to the source of the NX NMOS transistor 344 through the NH NMOS transistors 345 and the PMOS transistor 342.

The compensation circuit 304 provides slew rate unaffected stability compensation and combined split stability compensation. The compensation circuit 304 comprises a plurality of resistors 350, 352-1 through 352-6, a plurality of capacitors 354-1, 354-2, 356, 358 and an NX NMOS transistor 360.

The resistor 350 and the capacitors 354-1 and 354-2 are coupled together in series to form an RC filter between the output voltage 132 and ground. The drain-source terminals of the NX NMOS transistor 360 and the capacitor 358 are connected in series between the common node formed of the source of the NX NMOS transistor 331 and the drain of the NX NMOS transistor 333 and ground. The gate of the NX NMOS transistor 360 is biased by the supply voltage (VSUP) 128. The NX NMOS transistor 360 and the capacitor 358 are not on for low voltages of the local high voltage input supply voltage 142. As the local high voltage input supply voltage 142 increases, the transistor 360 and capacitor 358 limit the voltage on the source of the NX NMOS transistor 331. In another embodiment, the compensation circuit 304 does not include a capacitor 358.

The resistors 352 and the capacitor 356 are series connected between the output voltage 136 from the output stage 108 and the current mirror 310. The resistors 352 are used instead of a diode connection in the current mirror 310. The resistors 352-1 and 352-2 are coupled together in series between the gate of the NX NMOS transistor 320, the gates of the NX NMOS transistor 322, and the NH NMOS transistor 326. The resistors 352-3 and 352-4 are coupled together in series and coupled to the series connected resistors 352-5 and 352-6. The resistor 352-3 may be selectively disconnected from the resistor 352-6. The capacitor 356 is coupled between the output signal 136 and the gate of the NH NMOS transistor 326.

The slew rate unaffected stability compensation is now described. The resistor 350 and the capacitors 354, 356 provide normal stability compensation. The NX NMOS transistor 360 and the capacitor 358 provide stability compensation without effecting the slew rate enhancement. The resistance of the resistor 350 and the capacitance of the capacitors 354, 356 may be selected sufficiently high for stability, but with adverse effect on the slew rate and the response of the operational amplifier. The NX NMOS 360 and the capacitor 358 provide stability compensation without affecting the slew rate. Such stability compensation operates as follows.

At say analog ground AGND, e.g. 1.2 V, the op amp is in buffer mode. The output voltage is 1.2+VTNZ. Thus, the NX NMOS transistor 360 is on which connects the capacitor 358 to the circuit as a compensation capacitor. As the up input voltage (VINP) 118 increases, the output voltage 132 (input voltage to source follower) increases. As the voltage passes VCC-VTNZ, the NX NMOS transistor 360 turns off, and disconnects the capacitor 358 from the circuit, therefore without effecting the slew rate.

The combined split stability compensation operation is now described. In one embodiment, the compensation circuit 304 does not include the resistors 352-1 through 352-6. In another embodiment, the compensation circuit 304 includes the resistors 352-1 through 352-6. The resistors 352-1 through 352-6 increase the circuit stability. In an embodiment without the resistors 352-1 through 352-6, the NH NMOS transistor 324 and the NX NMOS transistor 320 are cascode diode connected to prevent the non-compensated signal on the gates of the NX NMOS transistor 322 and the NH NMOS transistor 326 from responding to voltage swings on the output voltage 136. The resistors 352-1 through 352-6 decouple the diode connected node from the non-compensated signal, and hence allow the non-compensated signal to respond to transients on the output voltage 136.

Intermediate Bias Stage:

Refer again to FIG. 1. The intermediate bias stage 104 generates the first and second bias voltages 134 and 135 for the intermediate folded current load stage 106.

Figure 4:
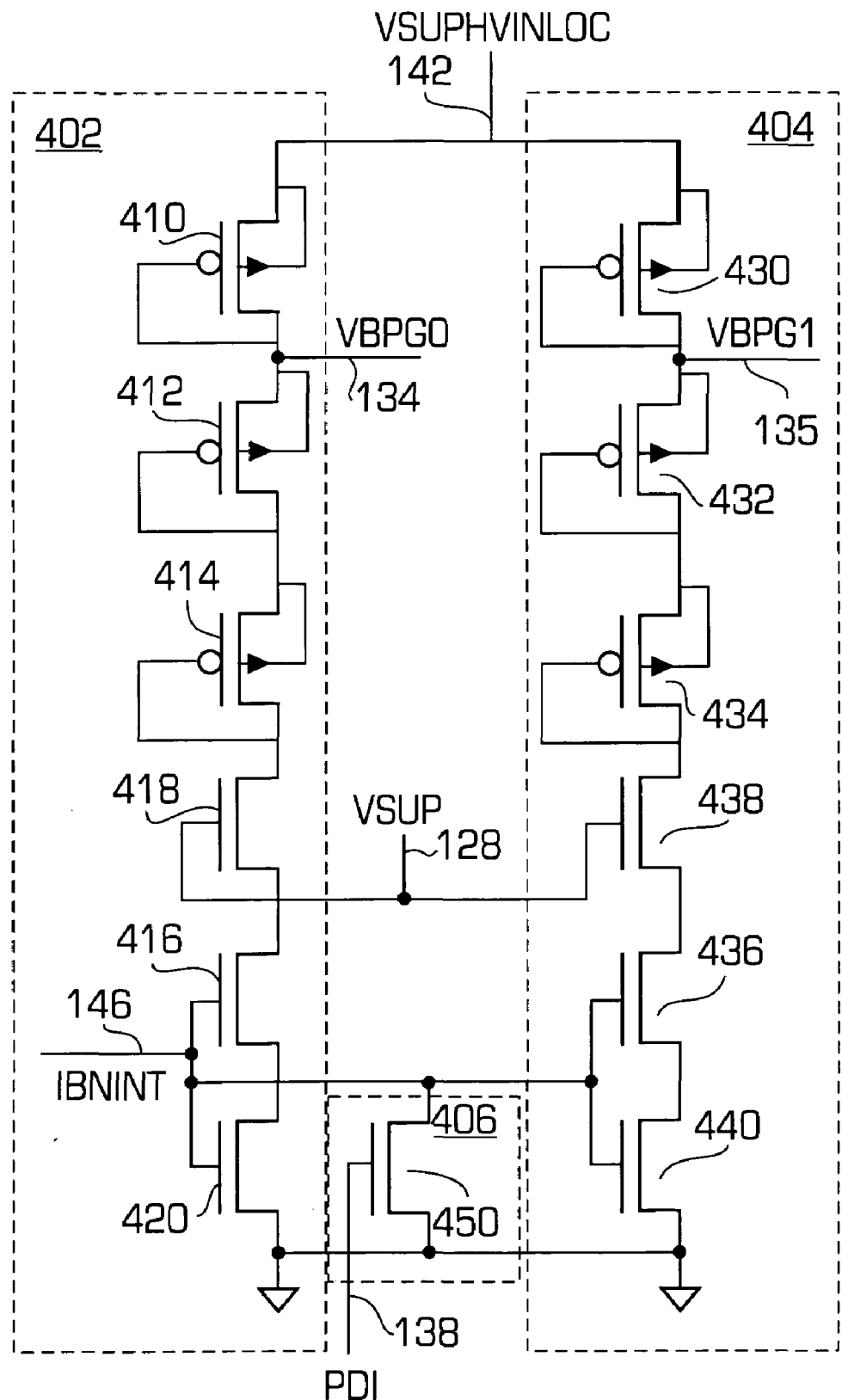
FIG. 4 is a schematic diagram of an intermediate bias stage of the high voltage operational amplifier of FIG. 1.

FIG. 4 is a schematic diagram of the intermediate bias stage 104. The intermediate bias stage 104 comprises a first bias circuit 402, a second bias circuit 404, and a power down circuit 406.

The first bias circuit 402 provides the bias (VBPG0 voltage 134) for the transistors (PMOS transistors 314 and 318) of the folded cascode 302 of the intermediate folded current load stage 106. The first bias circuit 402 comprises PMOS transistors 410, 412, 414 and NX NMOS transistor 416, and NH NMOS transistors 418, 420. The PMOS transistors 410, 412, 414 are diode connected. The PMOS transistor 410 provides bias for the intermediate folded current load stage 106. The PMOS transistor 410 is sized appropriately for proper operation of the cascode 302. The PMOS transistor 410 includes drain-source terminals coupled between the local high voltage input supply voltage (VSUPHVINLOC) signal 142 and the first bias voltage (VBPG0) 134. The PMOS transistors 412 and 414 and the NH NMOS transistor 418 buffer against high voltage. The diode connected PMOS transistors 412 and 414 include drain-source terminals connected in series between first bias voltage (VBPG0) 134 and the drain terminal of the NH NMOS transistor 418. The gate of the NH NMOS transistor 418 receives the supply voltage (VSUP) signal 128. The NX NMOS transistor 416 and the NH transistor 420 provide current bias and include drain-source terminals connected together in series between the source terminal of the NH NMOS transistor 418 and ground. The gates of the NMOS transistors 416 and 420 are coupled together and biased by the intermediate stage bias current (IBNINT) signal 146 from the current bias generator 112.

The second bias circuit 404 provides the bias (VPG1 voltage 135) for the transistors (PMOS transistors 316 and 319) of the folded cascode 302 of the intermediate folded current load stage 106. The second bias circuit 404 comprises PMOS transistors 430, 432, 434 and NX NMOS transistor 436, and NH NMOS transistors 438, 440. The PMOS transistors 430, 432, 434 are diode connected. The PMOS transistor 430 provides bias for the intermediate folded current load stage 106. The PMOS transistor 430 is sized appropriately for proper operation of the cascode 302. The PMOS transistor 430 includes drain-source terminals coupled between the local high voltage input supply voltage (VSUPHVINLOC) signal 142 and the second bias voltage (VBPG1) 135. The PMOS transistors 432 and 434 and the NH NMOS transistor 438 buffer against high voltage. The diode connected PMOS transistors 432 and 434 include drain-source terminals connected in series between the second bias voltage (VBPG1) 135 and the drain terminal of the NH NMOS transistor 438. The gate of the NH NMOS transistor 438 receives the supply voltage (VSUP) signal 128. The NX NMOS transistor 436 and the NH transistor 440 provide current bias and include drain-source terminals connected together in series between the source terminal of the NH NMOS transistor 438 and ground. The gates of the NX NMOS transistor 436 and the NH NMOS transistor 440 are coupled together and biased by the intermediate stage bias current (IBNINT) signal 146 from the current bias generator 112.

The second bias circuit 404 provides a multiple for preventing breakdown. In one embodiment, the transistors of the second bias circuit 404 have a ¼ ratio relative to the transistors of the first bias circuit 402.

The power down circuit 406 comprises an NH NMOS transistor 450. The drain-source terminals of the NH NMOS transistor 450 couple the common node formed of the gates of the NX transistors 416, 436 and the NH transistors 420, 440 to ground to turn off the NX transistors 416, 436 and the NH transistors 420, 440 in response to the power down (PDI) signal 138 being applied to the gate of the NH NMOS transistor 450.

Output Stage:

Refer again to FIG. 1. The output stage 108 is a power amplifier stage. The output stage 108 amplifies the output voltage 132 from the intermediate folded current load stage 106 and generates the output signal 136. The up input voltage (VINP) 118, the second adaptive bias voltage (VDYMCSDP) signal 154 from the adaptive and fixed high voltage bias stage 110, and an output stage bias current (IBNOUT) 131 from the current bias generator 112 to control biasing of the output stage 108.

Figure 5:
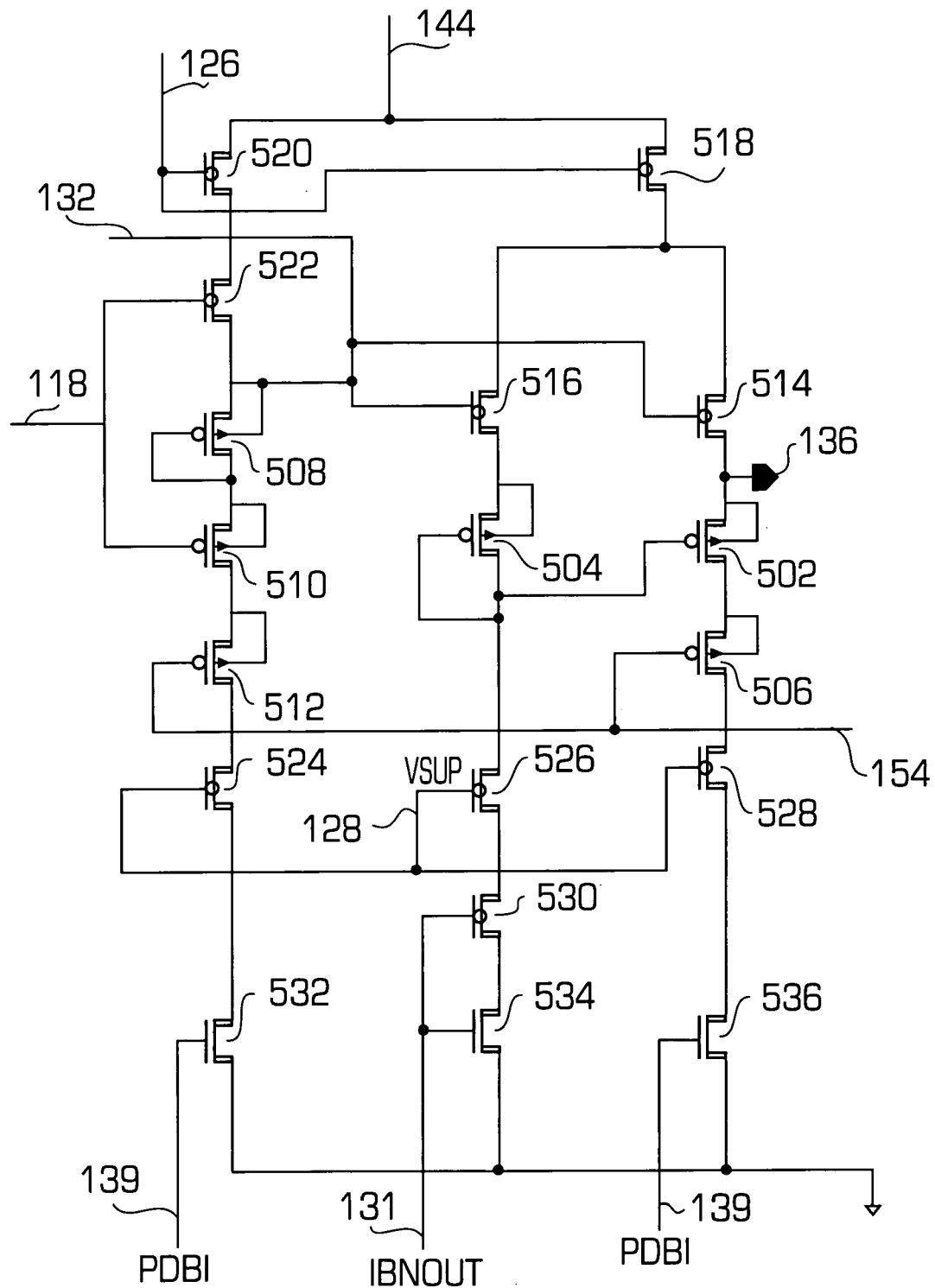
FIG. 5 is a schematic diagram of an output stage of the high voltage operational amplifier of FIG. 1

FIG. 5 is a schematic diagram of the output stage 108 according to the present invention. The output stage 108 comprises PMOS transistors 502, 504, 506, 508, 510, 512, NX NMOS transistors 514, 516, 518, 520, 522, 524, 526, 528, 530 and NH NMOS transistors 532, 534, 536.

In one embodiment, the output stage 108 is a class AB push-pull source follower stage. The cascode has adaptive inputs from both the up portion of the circuit and the down transistors of the circuit.

The NX NMOS transistor 514 and the PMOS transistor 502 form an output driver in which the NX NMOS transistor 514 provides the up output voltage and the PMOS transistor 516 provides the down output voltage. The drain-source terminals of the NX NMOS transistor 514 and the PMOS transistor 502 are coupled together in series to form an output node formed of the source of the NX NMOS transistor 514 and the source of the PMOS transistor 502 to provide the output voltage 136. The NX NMOS transistor 514 functions as a source follower for the up output voltage. The PMOS transistor 502 functions as a source follower for the down output voltage.

The NX NMOS transistor 516 and the PMOS transistor 504 bias the output driver formed of the PMOS transistor 502 and the NX NMOS transistor 514. The drain-source terminals of the NX NMOS transistor 516 and the PMOS transistor 504 are coupled together in series and coupled in parallel between the drain of NX NMOS transistor 514 and the gate of the PMOS transistor 502. The gates of the NMOS transistors 514 and 516 are coupled together and to the output node of the intermediate folded current load stage 106 which provides the output voltage 132. The PMOS transistor 504 is diode connected with the gate and drain thereof being connected together, and also coupled to the gate of the PMOS transistor 502.

The NX NMOS transistors 518 and 520 and the PMOS transistors 506 and 512 provide a buffer for the adaptive high voltage bias for the output driver. The PMOS transistor 512 and the NX NMOS transistor 522 prevent breakdown for up and down movement of the high voltage supply voltage (VSUPHV) 144. The NX NMOS transistor 518 includes drain-source terminals coupled between the high voltage supply voltage (VSUPHV) 144 and the drain terminal of the NX NMOS transistor 514, and includes a gate biased by the first adaptive bias voltage (VDYMCSD) signal 126. The NX NMOS transistor 520 includes a drain terminal coupled to the high voltage supply voltage (VSUPHV) signal 144, and includes a gate biased by the first adaptive bias voltage (VDYMCSD) signal 126. The PMOS transistor 506 includes a gate biased by the second adaptive bias voltage (VDYMCSDP) 154, and includes a source coupled to the drain of the PMOS transistor 502. The PMOS transistor 512 includes a gate coupled to the gate of the PMOS transistor 506 and biased by the second adaptive bias voltage (VDYMCSDP) 154.

The NX transistors 520, 522, 524, the NH transistor 532 and the PMOS transistors 508, 510, 512 provide feed forward slew rate enhancement. As the up input voltage (VINP) 118 increases, the NX NMOS transistor 522 by source follower operation pulls up the output voltage 136 to follow, as a source follower, the up input voltage (VINP) 118 by two threshold VTNX (threshold voltage of NX NMOS transistor) less. As the up input voltage (VIPUP) 118 stabilizes, the normal operation of the operational amplifier 100 takes over to pull the output voltage 136 to a stabilized voltage.

As the up input voltage (VINP) 118 decreases, the PMOS transistor 510 by source follower operation pulls down the output voltage 136 to follow the up input voltage (VINP) 118 by two threshold VTP (threshold voltage of PMOS transistor) less and one threshold VTNX more. As the up input voltage (VINP) 118 stabilizes, the normal operation of the operational amplifier takes over to pull the output voltage 136 to a stabilized voltage. Hence the operational amplifier 100 operates normally for the last fraction of the full voltage swing.

The NX NMOS transistor 522 includes a drain coupled to the source of the NX NMOS transistor 520, includes a gate biased by the up input voltage (VINP) 118, and includes a source coupled to the common node formed of the gates of the NX NMOS transistors 514 and 516 and the output voltage 132. The PMOS transistor 508 is a source follower for slew rate enhancement, which is described below. The PMOS transistor 508 provides a precharge for the output driver formed of the NX NMOS transistor 514 and the PMOS transistor 502. The PMOS transistor 508 includes a source coupled to the common node of the source of the NX NMOS transistor 522 and the gate of the NX NMOS transistor 516, and includes a gate and a drain that are coupled together. The PMOS transistor 510 provides precharge to the output driver similar to the PMOS transistor 508, but for lower voltage. The PMOS transistor 510 includes a source coupled to the drain of the PMOS transistor 508 and includes a gate biased by the up input voltage (VINP) 118. The PMOS transistor 512 includes a source coupled to the drain of the PMOS transistor 510 and includes a gate biased by the second adaptive bias voltage (VDYMCSDP) 154 from the adaptive and fixed high voltage bias stage 110.

The NX NMOS transistors 524, 526, 528 buffer the HV bias. The drains of the NX NMOS transistors 524, 526, 528 are coupled to the source terminals of the PMOS transistors 512, 504, 506, respectively. The gates of the NX NMOS transistors 524, 526, 528 are coupled together and biased by the supply voltage (VSUP) 128.

The NX NMOS transistor 530 and the NH NMOS transistor 534 provide current bias. The NX NMOS transistors 530 and 534 include drain-source terminals that are coupled together in series between the source of the NX NMOS transistor 526 and ground, and include gates coupled together and to the output stage bias current (IBNOUT) 131.

The NH NMOS transistors 532 and 536 shut down the output stage 108 during power down. The NH NMOS transistor 532 includes drain-source terminals coupled between the source of the NX NMOS transistor 524 and ground, and includes a gate terminal coupled to the inverted power down (PDBI) signal 139. The NH NMOS transistor 536 includes drain-source terminals coupled between the source of the NX NMOS transistor 528 and ground, and includes a gate terminal coupled to the inverted power down (PDBI) signal. During normal operation, the inverted power down (PDBI) signal 139 is high and the NH NMOS transistors 532 and 536 are on. During power down, inverted power down (PDBI) signal 139 becomes low, and the NH NMOS transistors 532 and 536 are turned off to thereby turnoff the output stage 108.

Adaptive and Fixed HV Bias Stage:

Refer again to FIG. 1. The adaptive and fixed high voltage bias stage 110 generates high voltages adaptive to the input voltage or the output voltage to provide Input Common Mode Input HV Bias (first adaptive bias voltage 126) and Output Source Follower HV Bias (first adaptive bias voltage 126 and second adaptive bias voltage 154). The adaptive and fixed high voltage bias stage 110 also provides fixed local medium voltages (local medium voltage 140).

Figure 6:
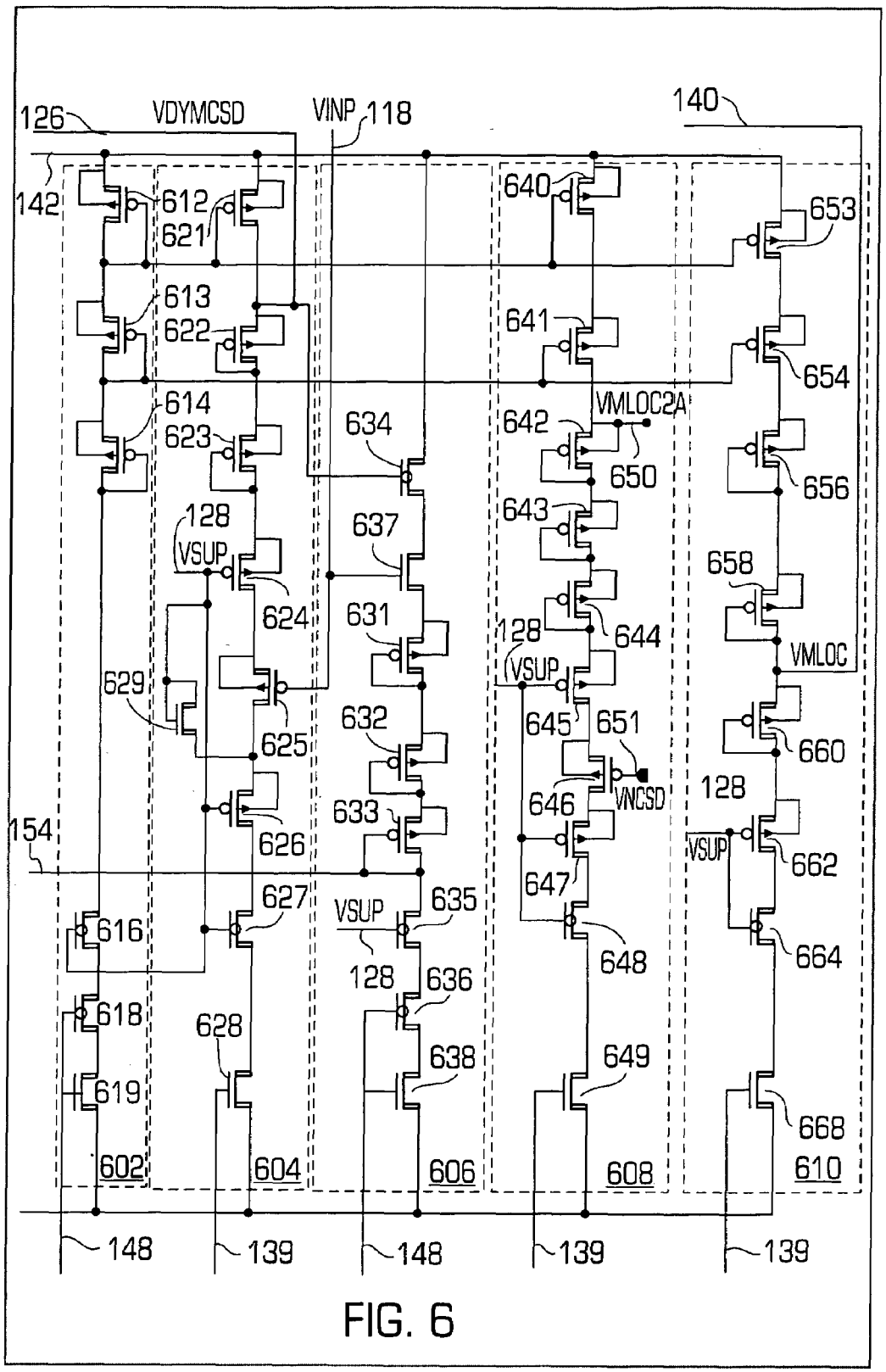
FIG. 6 is a schematic diagram of an adaptive and fixed high voltage bias stage of the high voltage operational amplifier of FIG. 1.

FIG. 6 is a schematic diagram of the adaptive and fixed high voltage bias stage 110 of the high voltage operational amplifier 100. The adaptive and fixed high voltage bias state 110 comprises a current bias circuit 602, a first adaptive bias voltage generator 604, a second adaptive bias voltage generator 606, a dynamic HV bias voltage generator 608, and a fixed local HV bias voltage generator 610.

The current bias circuit 602 provides a current bias as a current mirror for the generators 604, 606, 608 and 610 of the adaptive and fixed HV bias stage 110. The current bias circuit 602 comprises PMOS transistors 612, 613, 614, NX NMOS transistors 616, 618 and an NH NMOS transistor 619. The PMOS transistors 612, 613, 614 are diode connected and include drain-source terminals coupled together in series between the local high voltage input supply voltage (VSUPHVINLOC) 142 and the drain of the NX NMOS transistor 616. The gate of the NX NMOS transistor 616 is biased by the supply voltage (VSUP) signal 128. The drain-source terminals of the NX NMOS transistor 618 and the NH NMOS transistor 619 are coupled in series between the source of the NX NMOS transistor 616 and ground. The gates of the NX NMOS transistor 618 and the NH NMOS transistor 619 are coupled together and biased by the high voltage bias state bias current (IBNHVBF) 148.

The first adaptive bias voltage generator 604 generates the first adaptive bias voltage (VDYMCSD) 126. The first adaptive bias voltage generator 604 uses the current bias circuit 602 as a current mirror. The first adaptive bias voltage generator circuit 604 comprises PMOS transistors 621, 622, 623, 624, 625, 626, an NX NMOS transistor 627 and NH NMOS transistors 628, 629. The PMOS transistor 621 functions as a current source. The PMOS transistor 621 includes drain-source terminals coupled between the local high voltage input supply voltage (VSUPHVINLOC) 146 and the first adaptive bias voltage (VDYMCSD) signal 126, and includes a gate biased by the drain of the PMOS transistor 612 of the current bias circuit 602. The PMOS transistors 622, 623, 624, 625 shift the level of the input voltage. The PMOS transistors 622, 623 are diode connected and include drain-source terminals coupled together in series between the drain of the PMOS transistor 621 and a source of the PMOS transistor 624. The gates of the PMOS transistors 624 and 626, and the NX NMOS transistor 627, and the NH NMOS transistor 629 are biased by the supply voltage (VSUP) signal 128.

The PMOS transistor 624 clamps its source to a voltage of VSUP+VTP (threshold voltage of PMOS transistor) in the event that the up input voltage (VINP) 118 is lower than the supply voltage (VSUP) 128. The PMOS transistor 625 causes the first adaptive bias voltage (VDYMCSD) 126 to follow the up input voltage (VINP) 118 by a voltage of 3 VTP. The PMOS transistor 625 includes a source coupled to the drain of the PMOS transistor 624 and includes a gate biased by the up input voltage (VINP) 118.

The NH NMOS transistor 629 clamps the drain of the PMOS transistor 625 at a minimum voltage of VSUP (supply voltage)–VTNH (threshold voltage of NH NMOS transistor). The NH NMOS transistor 629 includes drain-source terminals coupled between the supply voltage (VSUP) 128 and the drain of the PMOS transistor 625, and includes a gate coupled to the supply voltage (VSUP) 128. The PMOS transistor 626 clamps its source at VSUP+VTPH when VINP is higher than VSUP to prevent drain of the NX NMOS transistor 627 from having too high of a voltage applied thereto. The NX NMOS transistor 627 and the NH NMOS transistor 628 include drain-source terminals connected in series between the source of the PMOS transistor 626 and ground. The gate of the NH NMOS transistor 628 is biased by the inverted power down (PDBI) signal 139.

The adaptive common input HV bias operates as follows. The first adaptive bias voltage (VDYMCSD) 126 is a function of the up input voltage (VINP) 118. As the up input voltage (VINP) 118 increases, the first adaptive bias voltage (VDYMCSD) 126 increases until it reaches the power supply rail. As the up input voltage (VINP) 118 decreases, the first adaptive bias voltage (VDYMCDS) 126 decreases until it is being clamped at a level of VSUP+3 VTP. This level is chosen to appropriately to bias the relevant transistors out of the breakdown voltages during operation of the operational amplifier 100.

The second adaptive bias voltage generator 606 generates the second adaptive bias voltage (VDYMCSDP) 154. The second adaptive bias voltage generator 106 uses the current bias circuit 602 as a current mirror. The second adaptive bias voltage generator 106 comprises PMOS transistors 631, 632, 633, NX NMOS transistors 634, 635, 636, and NH NMOS transistors 637, 638. The NX NMOS transistor 634 and the NH NMOS transistor 637 include drain-source terminals coupled between the local high voltage input supply voltage (VSUPHVINLOC) 142 and the source of the PMOS transistor 631. The gate of the NX NMOS transistor 634 is biased by the first adaptive bias voltage (VDYMCSD) 126. The gate of the NH NMOS transistor 637 is biased by the up input voltage (VINP) 118. The PMOS transistors 631, 632, 633 are diode connected and include drain-source terminals coupled in series between the source of the NH NMOS transistor 637 and the drain of the NX NMOS transistor 638. The drain of the PMOS transistor 633 provides the second adaptive bias voltage (VDYMCSDP) 154. The gate of the NX NMOS transistor 635 is biased by the supply voltage (VSUP) 128. The NX NMOS transistor 636 and the NH NMOS transistor 638 include drain-source terminals connected in series between the source of the NX NMOS transistor 635 and ground and include gates coupled together and biased by the high voltage bias voltage bias current (IBNHVBF) 148.

The adaptive push-pull source follower output HV bias operates as follows. The first adaptive bias voltage (VDYMCSD) 126 is generated as described above. The second adaptive bias voltage (VDYMCSDP) 154 is a function of the up input voltage (VINP) 118, =VINP−(3 VTP+ VTN). This level is chosen as a fraction of the HV supply to bias the relevant transistors out of the breakdown voltages region. As the up input voltage (VINP) 118 increases, the VDYMCSDP 154 increases. As the up input voltage (VINP) 118 decreases, the second adaptive bias voltage (VDYMCSDP) 154 decreases until it reaches ground.

The fixed local HV bias voltage generator 610 generates a fixed local HV bias. In one embodiment, the fixed local HV bias is the local medium voltage (VMLOC) 140. The fixed local HV bias voltage generator 610 uses the current bias circuit 602 as a circuit mirror. The fixed local HV bias voltage generator 610 comprises PMOS transistors 653, 654, 656, 658, 660 and 662, a NX NMOS transistor 664, and a NH NMOS transistor 668. The PMOS transistor 653 includes a source terminal coupled to the local high voltage input supply voltage 142 and a gate terminal biased by the common node of the gate and drain of the PMOS transistor 612. The PMOS transistor 654 includes a source terminal coupled to the drain terminal of the PMOS transistor 653 and includes a gate biased by the common node formed of the gate and drain of the PMOS transistor 613. The PMOS transistor 656 and 658 are diode connected with the gate and drain thereof coupled together. The PMOS transistors 656 and 658 are connected in series between the drain of the PMOS transistor 654 and the source of the PMOS transistor 660. The drain of the PMOS transistor 658 provides the local medium voltage (VMLOC) 140. The PMOS transistor 660 is diode connected with its gate and drain coupled together. The PMOS transistor 662 includes drain-source terminals coupled between the drain terminal of the PMOS transistor 660 and the drain of the NX NMOS transistor 664. The PMOS transistor 662 and the NX NMOS transistor 664 are biased by the supply voltage 128. The NH NMOS transistor 668 includes drain-source terminals coupled between the source of the NX NMOS transistor 664 and ground and includes a gate biased by the inverted power down (PDBI) signal 139.

The dynamic HV bias voltage generator 608 generates a dynamic HV bias voltage (VMLOC2A) 650. The dynamic HV bias voltage generator 608 uses the current bias 602 as a current mirror. The dynamic HV bias voltage generator 608 comprises PMOS transistors 640, 641, 642, 643, 644, 645, 646, 647, an NX NMOS transistor 648, and an NH NMOS transistor 649. The PMOS transistor 640 includes a source terminal coupled to the local high voltage input supply voltage 142, and includes a gate coupled to the common node formed of the gate and drain of the PMOS transistor 612 for biasing thereof. The PMOS transistor 641 includes drain-source terminals coupled between the drain terminal of the PMOS transistor 640, and the source terminal of the PMOS transistor 642, and includes a gate coupled to the common node formed of the gate and drain of the PMOS transistor 613 for biasing thereof. The drain of the PMOS transistor 641 provides the second local medium voltage (VMLOC2A) 650. In other embodiments, the local medium voltage signal 650 may be used to increase the breakdown voltage of appropriate transistors. For example, the local medium voltage signal 650 may be applied to the gate of the transistor 212 or the gate of the transistor 332 and 333 to increase the breakdown voltage thereof. The PMOS transistors 642, 643 and 644 are diode connected with the gate coupled to the drain of the corresponding transistor. The PMOS transistors 643 and 644 are coupled together in series between the drain of the PMOS transistor 642 and the source of the PMOS transistor 645. The gates of the PMOS transistors 645, 647 and the NX NMOS transistor 648 are biased by the supply voltage (VSUP) 128. The PMOS transistor 646 includes drain-source terminals coupled between the drain of the PMOS transistor 645 and the source of the PMOS transistor 647, and that includes a gate biased by a dynamic bias signal (VNCSD) 651, which may be the output voltage 136, the input voltage 118, or the voltage 132 as appropriate for the function. The PMOS transistor 647 includes drain-source terminals coupled between the drain of the PMOS transistor 646 and the drain of the NX NMOS transistor 648. The NH NMOS transistor 649 includes drain-source terminals coupled between the source of the NX NMOS transistor 648 and ground, and includes a gate biased by the inverted power down (PDBI) signal 139.

Bias Circuit

Figure 7:
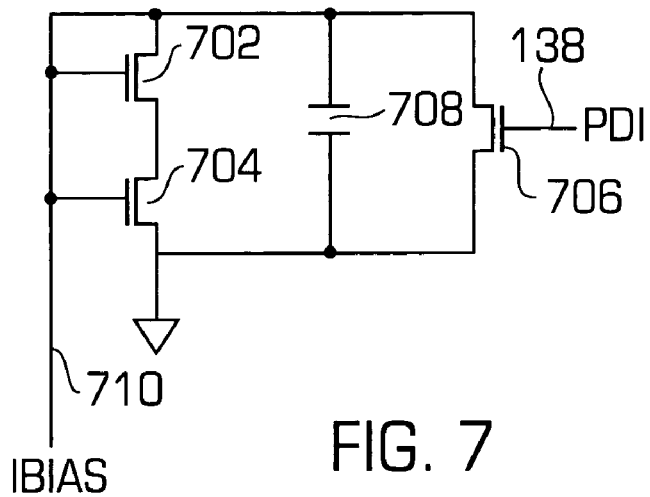
FIG. 7 is a schematic diagram of a current input bias circuit of the high voltage operational amplifier of FIG. 1.

FIG. 7 is a schematic diagram of a current input bias circuit 116 of the high voltage operational amplifier 100. The current input bias circuit 116 comprises a plurality of local bias filters 116-1 through 116-4. The current input bias circuit 116 provides multiple bias for noise reduction.

FIG. 7 shows one embodiment of the local bias circuit 116-1 through 116-4. Each of the local bias circuits 116-1 through 116-4 may include transistors and capacitors that have different electrical characteristics depending on the electrical requirements.

The current input bias circuit 116 comprises an NX NMOS transistor 702, NH NMOS transistors 704 and 706, and a capacitor 708. The NX NMOS transistor 702 and the NH NMOS transistor 704 provide decoupled current biases with local filtering from the capacitor 708. The drain-source terminals of the NX NMOS transistor 702 and the NH NMOS transistor 704 are coupled together in series between a bias (IBIAS) signal 710 and ground. The bias (IBIAS) signal 710 depends on which of the bias currents 130, 131, 146, 148 is being filtered. The gates of the NX NMOS transistor 702 and the NH NMOS transistor 704 are coupled together and to the drain of the NX NMOS transistor 702. The NH NMOS transistor 706 is used for power down. The drain-source terminals of the NH NMOS transistor 706 are coupled between the bias (IBIAS) signal 710 and ground to ground the bias signal 710 in response to the power down (PDI) signal 138 being applied to the gate of the NH NMOS transistor 706. The capacitor 708 is coupled between the bias signal 710 and ground. The capacitor 708 provides local filtering.

Current Bias Generator:

Refer again to FIG. 1. The current bias generator 112 generates the differential input stage bias current (IBNDIF) 130, the output stage bias current (IBNOUT) 131, the intermediate stage bias current (IBNINT) 146, and the high voltage bias stage bias current (IBNHVBF) 148. Cross talk between the stages 102, 104, 108, 110 is reduced by providing each stage with its own bias current.

Figure 8:
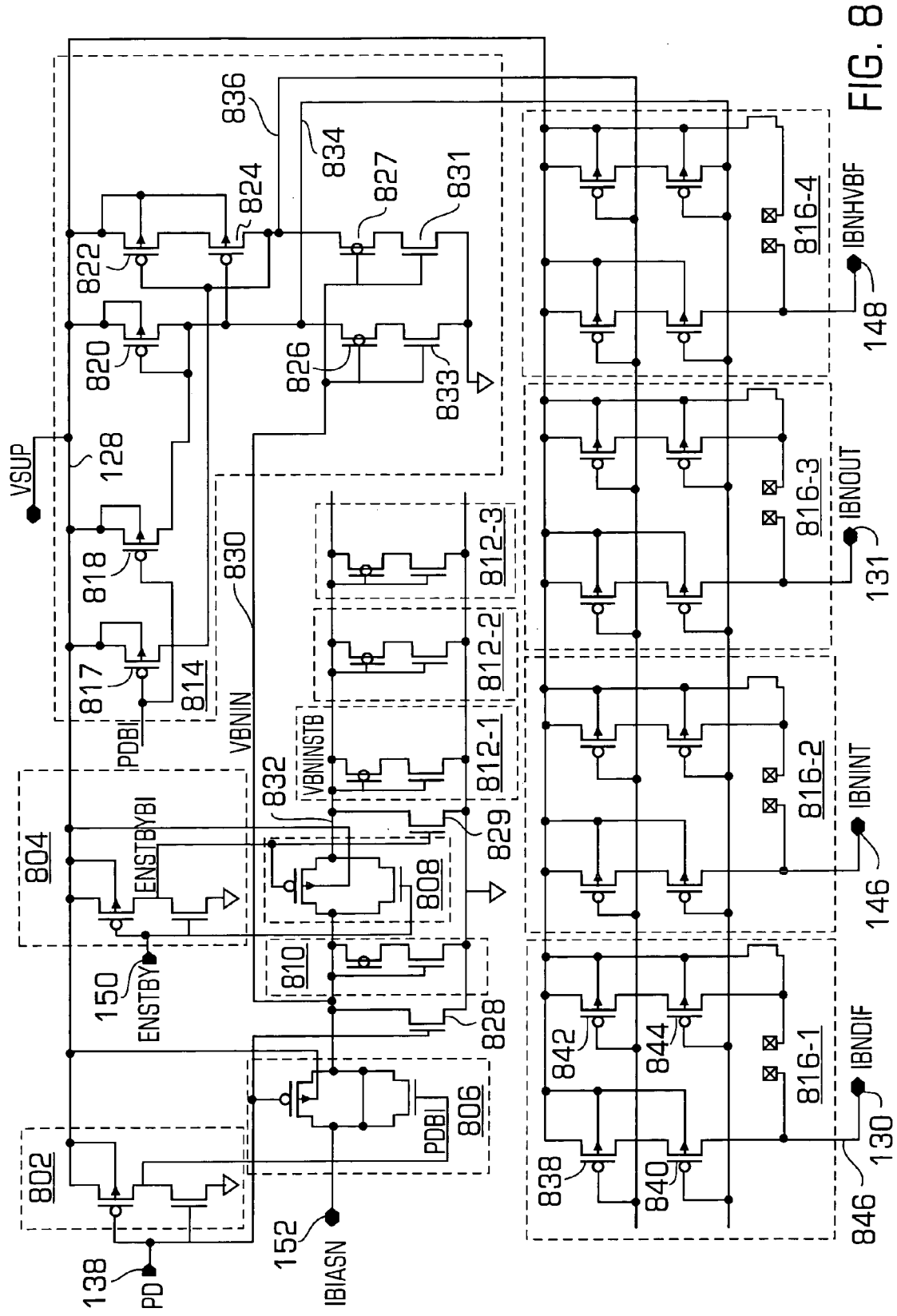
FIG. 8 is a schematic diagram of a current bias generator of the high voltage operational amplifier of FIG. 1.

FIG. 8 is a schematic diagram of a current bias generator 112 of the high voltage operational amplifier 100. The current bias generator 112 comprises inverters 802, 804, transfer gates 806, 808, a bias circuit 810, a plurality of standby bias circuits 812, a bias control circuit 814, a plurality of bias current stages 816-1 through 816-4, and NMOS transistors 828, 829.

The input bias (IBIASN) current 152 is applied via the transfer gate 806 to an input bias voltage (VBNIN) line 830, which biases the bias control circuit 814. The transfer gate 806 is controlled by the power down (PDI) signal 138 and an inverted power down signal from the inverter 802. A low level of the power down signal 138 turns on the transfer gate

806. The NMOS transistor 828 includes drain-source terminals coupling the input bias voltage (VBNIN) line 830 to ground in response to a high level of the power down signal 138 applied to a gate thereof.

The bias circuit 810 controls the bias of the input bias voltage (VBNIN) line 830. The bias circuit 810 comprises a PMOS transistor and an NMOS transistor that include drain-source terminals coupled together in series between the input bias voltage (VBNIN) line 830 and ground, and include gates coupled together and to the input bias voltage (VBNIN) line 830.

The standby bias circuits 812-1 through 812-3 reduces the current bias on the input bias voltage (VBNIN) line 830 in the event that the standby enable (ENSTBY) signal 150 is high. For the sake of illustration, only three standby bias circuits 812 are shown. However, the current bias generator 112 may include more or less standby bias circuits 812 depending on the desired bias currents. Also for the sake of clarity, only the internal circuit of standby bias circuit 812-1 is shown.

The transfer gate 808 controls the connection of the standby bias circuits 812 to the input bias voltage (VBNIN) line 830 in response to the standby enable (ENSTBY) signal 150. Specifically, the input bias voltage (VBNIN) line 830 is coupled via the transfer gate 808 to a standby input bias voltage (VBNINSTB) line 832. The transfer gate 808 is controlled by the standby enable (ENSTBY) signal 150 and an inverted standby enable from the inverter 804. A high level of the standby enable signal 150 turns on the transfer gate 806. The NMOS transistor 829 includes drain-source terminals coupling the standby input bias voltage (VBNINSTB) line 832 to ground in response to a low level of the standby enable signal 150 applied to a gate thereof.

Each standby bias circuit 812-1 through 812-3 comprises a native NMOS transistor and an NMOS transistor that include drain-source terminals coupled together in series between the standby input bias voltage (VBNINSTB) line 832 and ground, and include gates coupled together and to the standby input bias voltage (VBNINSTB) line 832.

The bias control circuit 814 provides bias current to the bias current stages 816-1 through 816-4. The bias control circuit 814 comprises PMOS transistors 817, 818, 820, 822, and 824, NX NMOS transistor 826, 827 and NMOS transistor 831, 833. The PMOS transistors 820, the NX NMOS transistor 826, and the NMOS transistors 833 provide a bias voltage to a first bias line 834, which is coupled to the bias current stages 816. The PMOS transistor 820 includes a source terminal coupled to the supply voltage 128 and is diode connected with its gate coupled to its drain and to the first bias line 834. The NX NMOS transistor 826 includes a drain terminal coupled to the source terminal of the PMOS transistor 820, and includes a gate coupled to the input bias voltage (VBNIN) line 830. The NMOS transistor 833 includes drain-source terminals coupled between the source of the NX NMOS transistor 826 and ground, and includes a gate coupled to the input bias voltage (VBNIN) line 830. The PMOS transistor 818 provides additional current to the first bias line 834 during power down. The PMOS transistor 818 includes drain-source terminals coupled between the supply voltage 128 and the common node formed of the gate and drain of the PMOS transistor 820, and includes a gate controlled by the inverted power down signal from the inverter 802.

The PMOS transistors 822, 824, the NX NMOS transistor 827 and the NMOS transistor 831 provide a bias current to a second bias line 836, which is coupled to the bias current stages 816. The PMOS transistor 822 includes a source terminal coupled to the supply voltage 128. The PMOS transistor 824 includes a source coupled to the drain of the PMOS transistor 822, includes a drain coupled to the second bias line 836, and includes a gate coupled to the common node of the drain of the PMOS transistor and the first bias line 834. The NX NMOS transistor 827 includes a drain terminal coupled to the common node formed of the first bias line 834 and the drain terminal of the PMOS transistor 824, and includes a gate coupled to the input bias voltage (VBNIN) line 830. The NMOS transistor 831 includes drain-source terminals coupled between the source of the NX NMOS transistor 827 and ground, and includes a gate coupled to the input bias voltage (VBNIN) line 830. The PMOS transistor 817 provides additional current to the second bias line 836 during power down. The PMOS transistor 817 includes drain-source terminals coupled between the supply voltage 128 and the common node formed of the second bias line 836 and the gate of the PMOS transistor 822, and includes a gate controlled by the inverted power down signal from the inverter 802.

The bias current stages 816-1 through 816-4 generate the differential input stage bias current (IBNDIF) 130, the intermediate stage bias current (IBNINT) 146, the output stage bias current (IBNOUT) 131, and the high voltage bias stage bias current (IBNHVBF) 148, respectively. Each bias current stage 816 comprises PMOS transistors 838, 840. (For clarity, only the transistors of the bias current stage 816-1 are labeled with reference numbers.) The PMOS transistors 838, 840 include drain-source terminals coupled together in series between the supply voltage 128 and an output terminal 846. The output terminal 846 provides the bias current (the differential input stage bias current (IBNDIF) 130, the intermediate stage bias current (IBNINT) 146, the output stage bias current (IBNOUT) 131, and the high voltage bias stage bias current (IBNHVBF) 148 for the bias current stage 816. The gate of the PMOS transistor 838 is biased by the second bias line 836. The gate of the PMOS transistor 840 is biased by the first bias line 834. In another embodiment, each bias current stage 816 may further comprise PMOS transistors 842, 844 for providing additional bias current on the output terminal 846. The PMOS transistors 842, 844 include drain-source terminals coupled together in series between the supply voltage 128 and the output terminal 846. The gate of the PMOS transistor 842 is biased by the second bias line 836. The gate of the PMOS transistor 844 is biased by the first bias line 834.

The transfer gate 808 is used to reduce power consumption by the operational amplifier 100 by reducing the ratio of the current bias by setting the standby enable (ENSTBY) signal 150 to a high level. In this mode, the operational amplifier 100 is not powered down, which may cause failure of the HV breakdown mechanism, but advantageously the operational amplifier 100 is not used in standby.

Figure 9:
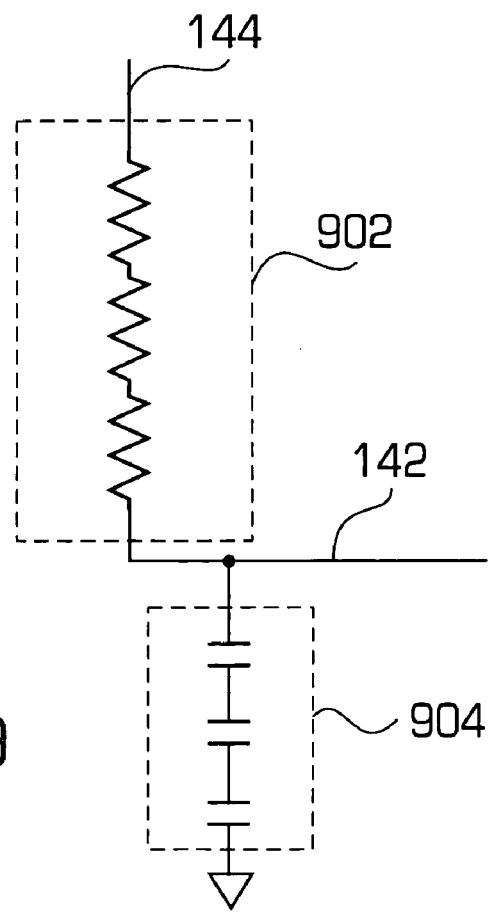
FIG. 9 is a schematic diagram of a local power (PS) pre-filter of the high voltage operational amplifier of FIG. 1.

Local Power Supply Pre-Filter:

FIG. 9 is a schematic diagram of the local power (PS) pre-filter 114 of the high voltage operational amplifier 100. The local power (PS) pre-filter 114 comprises a resistive element 902 and a capacitive element 904.

The local power supply (PS) pre-filter 114 is a local filter for the pre-driver stages 104, 106 and 110. The pre-filter 114 filters the ripple on the high voltage supply voltage (VSUPHV) 144 and generates the local high voltage input supply voltage (VSUPHVINLOC) 142. In one embodiment, a charge pump (not shown) generates the high voltage supply voltage (VSUPHV) 144 and causes the ripple. By applying the local high voltage input supply voltage (VSUPHVINLOC) 142 only to the pre-driver stages (intermediate bias stage 104, intermediate folded current load stage 106, adaptive and fixed high voltage bias stage 110), the voltage drop across the pre-filter 114 is minimized because the majority of the current flows in the output stage 108 and not the pre-driver stages. In one embodiment, the voltage drop is several millivolts. Hence an improved power and overhead voltage is achieved with the filtering.

The resistive element 902 and the capacitive element 904 are coupled in series between the high voltage supply voltage (VSUPHV) 144 and ground wherein the resistive element 902 generates the local high voltage input supply voltage (VSUPHVINLOC) 142. In one embodiment, the resistive element 902 comprises at least one resistor. Multiple resistors may be connected together in series or in parallel. In one embodiment, the capacitive element 904 comprises at least one capacitor. Multiple capacitors may be connected together in series or in parallel.

Therefore, the present invention provides a two-stage operational amplifier 100 that include a differential amplifier (differential input stage 102) and a common source stage (output stage 108). The operational amplifier 100 may be used in applications such as flash memories that operate with high voltages, such as 13 volts. In one embodiment, the folded cascode arrangement keeps the differential amplifier 102 in saturation. In one embodiment, the folded cascode arrangement with the differential amplifier provides a zero threshold voltage to allow a large swing in the output voltage range. In another embodiment, ripple on the supply voltage line 128 is the same on both parts of the differential amplifier 102 so that the ripple does not affect the output voltage.

The operational amplifier 100 consumes low power, but has a high slew rate and stability. The local power supply pre-filter 114 reduces ripple on the high voltage supply voltage 144, even if the voltage 144 is generated by a charge pump. The operational amplifier 100 provides transient recovery without affecting the normal operation of the operational amplifier 100.

In this disclosure, there is shown and described only the preferred embodiments of the invention, but, as aforementioned, it is to be understood that the invention is capable of use in various other combinations and environments and is capable of changes or modifications within the scope of the inventive concept as expressed herein.

What is claimed is:

1. An operational amplifier comprising:
   a differential input stage including an adaptive high voltage differential pair for providing first and second output currents in response to first and second input voltage signals and a first adaptive bias voltage applied thereto;
   an intermediate bias stage providing at least one bias signal;
   an intermediate stage for converting the first and second output currents into a first output signal in response to said at least one bias signal; and
   an output stage including a class AB source follower driver for generating a second output signal in response to the first output signal and the first adaptive bias voltage, the first adaptive bias voltage being at a voltage level to avoid device breakdown within the operational amplifier.

2. The operational amplifier of claim 1 further comprising an adaptive bias stage coupled to the differential input stage and the output stage for providing the first adaptive bias voltage, wherein the first adaptive bias voltage is an adaptive high voltage bias.

3. The operational amplifier of claim 2 further comprising a plurality of local bias filters, one of said plurality of local bias filters being disposed adjacent each of the differential input stage, intermediate bias stage, adaptive bias stage, and the output stage to filter a corresponding bias voltage applied thereto.

4. The operational amplifier of claim 1 wherein the output stage includes an output driver and an active circuit to provide a feed forward signal to precharge the output driver.

5. The operational amplifier of claim 1 further comprising a plurality of local bias filters, one of said plurality of local bias filters being disposed adjacent each of the differential input stage, intermediate bias stage, and the output stage to filter a corresponding bias voltage applied thereto.

6. An operational amplifier comprising:
   a differential input stage including an adaptive high voltage differential pair for providing first and second output currents in response to first and second input voltage signals and a first adaptive bias voltage applied thereto;
   an intermediate bias stage providing at least one bias signal;
   an intermediate stage for converting the first and second output currents into a first output signal in response to said at least one bias signal;
   an output stage including a class AB source follower driver for generating a second output signal in response to the first output signal and the first adaptive bias voltage; and
   a filter for providing a local supply voltage to the intermediate bias stage and the intermediate stage in response to a high voltage supply voltage, and wherein the high voltage supply voltage is applied to the output stage.

7. An operational amplifier comprising:
   a differential input stage including an adaptive high voltage differential pair for providing first and second output currents in response to first and second input voltage signals and a first adaptive bias voltage applied thereto;
   an intermediate bias stage providing at least one bias signal;
   an intermediate stage for converting the first and second output currents into a first output signal in response to said at least one bias signal;
   an output stage including a class AB source follower driver for generating a second output signal in response to the first output signal and the first adaptive bias voltage; and
   a bias stage coupled to the differential input stage, the intermediate bias stage, and the output stage to provide a corresponding bias voltage thereto, the first adaptive bias voltage being at a voltage level to avoid device breakdown within the operational amplifier.

8. The operational amplifier of claim 7 wherein the bias voltage has a first level for a normal operation mode and a second level for a standby mode.

9. The operational amplifier of claim 7 further comprising a plurality of local bias filters, one of said plurality of local bias filters being disposed adjacent each of the differential input stage, intermediate bias stage, and the output stage to filter the corresponding bias voltage applied thereto.

10. An adaptive differential pair circuit comprising:
    a differential pair including first and second input voltage terminals and generating first and second output currents in response to voltages applied to said first and second input voltage terminals;

a bias circuit coupled to the differential pair for providing a bias current;

a first buffer circuit coupled to the bias circuit to limit low end levels of high voltage supply voltages applied to the differential pair and the bias circuit; and a second buffer circuit coupled to the differential pair to lower said high voltage supply voltages applied to the differential pair in response to an adaptive high voltage bias applied thereto.

11. The adaptive differential pair circuit of claim 10 wherein the bias circuit provides the bias current in response to an adaptive voltage applied thereto.

12. An adaptive high voltage source follower output amplifier comprising:

a class AB push-pull source follower amplifier circuit for providing an output voltage in response to an input voltage; and a buffer circuit coupled to the class AB push-pull source follower amplifier circuit for limiting a level of a high voltage power signal applied to the class AB push-pull source follower amplifier circuit to causes voltages levels within the class AB push-pull source follower amplifier circuit to be at levels to avoid device breakdown within the class AB push-pull source follower amplifier circuit in response to an adaptive bias voltage.

13. The adaptive high voltage source follower output amplifier of claim 12 further comprising a feed forward slew rate enhancement circuit coupled to the buffer circuit and the class AB push-pull source follower amplifier circuit to provide a precharge to the class AB push-pull source follower amplifier circuit in response to another input voltage.

14. An intermediate folded current load stage comprising:

a folded cascode including up and down current input terminals and first and second bias voltage terminals;

an adaptive high voltage circuit coupled to the folded cascode to provide an adaptive bias voltage in response to a high voltage signal;

an output circuit providing an output voltage to an output terminal in response to up and down current inputs and first and second bias voltages; and a current source coupled to the output circuit for providing a current for said output circuit, the adaptive bias voltage being at a voltage level to avoid device breakdown within the output circuit.

15. The intermediate folded current load stage of claim 14 further comprising:

first and second fixed bias voltage generators coupled to the folded cascode for providing the first and second bias voltages, at least one of the first and second voltage generators comprising:

a current source;

a buffer circuit to limit the voltage level of the fixed bias voltage; and a bias voltage source for limiting an applied bias voltage to generate the bias voltage.

16. The intermediate folded current load stage of claim 14 further comprising a recovery circuit coupled in parallel to the folded cascode to clamp current on said up and down input terminals in response to transients.

17. The intermediate folded current load stage of claim 14 wherein the bias voltage is fixed.

18. The intermediate folded current load stage of claim 14 wherein the bias voltage is adaptive.

19. The intermediate folded current load stage of claim 14 further comprising a split stability compensation circuit coupled between the output terminal and the current source to control said current in response to the output voltage.

20. An operational amplifier comprising:

a differential input stage including an adaptive high voltage differential pair for providing first and second output currents in response to first and second input voltage signals, a first adaptive bias voltage, and a first bias current applied thereto, the first bias current having a first level for a normal operating mode and a second level for a standby mode, said second level being less than said first level;

an intermediate bias stage providing at least one bias signal in response to a second bias current the second bias current having a first level for said normal operating mode and a second level for said standby mode, said second level being less than said first level;

an intermediate stage for converting the first and second output currents into a first output signal in response to said at least one bias signal; and an output stage including a class AB source follower driver for generating a second output signal in response to the first output signal, the first adaptive bias voltage, and a third bias current, the third bias current having a first level for said normal operating mode and a second level for said standby mode, said second level being less than said first level, the mode does not power down the differential stage, the intermediate bias stage, and the output stage and maintains voltage levels within the differential stage, the intermediate bias stage, and the output stage at a level below breakdown voltage levels.

* * * * *